United States Patent [19]

Hedman et al.

[11] Patent Number: 4,819,180

[45] Date of Patent: Apr. 4, 1989

[54] VARIABLE-LIMIT DEMAND CONTROLLER FOR METERING ELECTRICAL ENERGY

[75] Inventors: Theodore A. Hedman, Littleton; Maynard L. Moe, Denver, both of Colo.

[73] Assignee: Dencor Energy Cost Controls, Inc., Denver, Colo.

[21] Appl. No.: 15,659

[22] Filed: Feb. 13, 1987

[51] Int. Cl.⁴ .................... H02J 1/00; G01R 19/00; G06F 15/56

[52] U.S. Cl. ........................... 364/492; 307/35; 307/39; 340/310 A; 340/825.5; 364/483; 364/493

[58] Field of Search .............. 364/483, 492, 493; 307/34, 35, 38, 39; 340/310 A, 825.5, 825.51; 361/332

[56] References Cited

U.S. PATENT DOCUMENTS

| | | | |
|---|---|---|---|
| 4,075,699 | 2/1978 | Schneider et al. | 364/492 |
| 4,247,786 | 1/1981 | Hedges | 340/310 A |
| 4,324,987 | 4/1982 | Sullivan, II et al. | 364/492 |
| 4,357,665 | 11/1982 | Korf | 364/492 |
| 4,389,577 | 6/1983 | Anderson et al. | 364/493 |
| 4,511,979 | 4/1985 | Amirante | 364/483 |
| 4,551,812 | 11/1985 | Gurr et al. | 364/492 |
| 4,583,182 | 4/1986 | Breddan | 364/492 |
| 4,620,283 | 10/1986 | Butt et al. | 307/35 |
| 4,695,737 | 9/1987 | Rabon et al. | 364/493 |

Primary Examiner—Parshotam S. Lall
Assistant Examiner—Kevin J. Teska
Attorney, Agent, or Firm—John E. Reilly

[57] ABSTRACT

A method and system for regulating power delivered to different commercial or residential users in which each user has variable demands for power consumption, there being a power source from which power is transmitted by a utility to each user and a utility control signal which is transmitted from the utility to each user in order to modify the power consumed by each user, the method and system of the present invention being characterized by measuring the power consumption of each user over a selected real time interval, and modifying the power consumption by each user by an amount directly related to the power consumption measurement of each user over that time interval.

16 Claims, 6 Drawing Sheets

Microfiche Appendix Included
(1 Microfiche, 84 Pages)

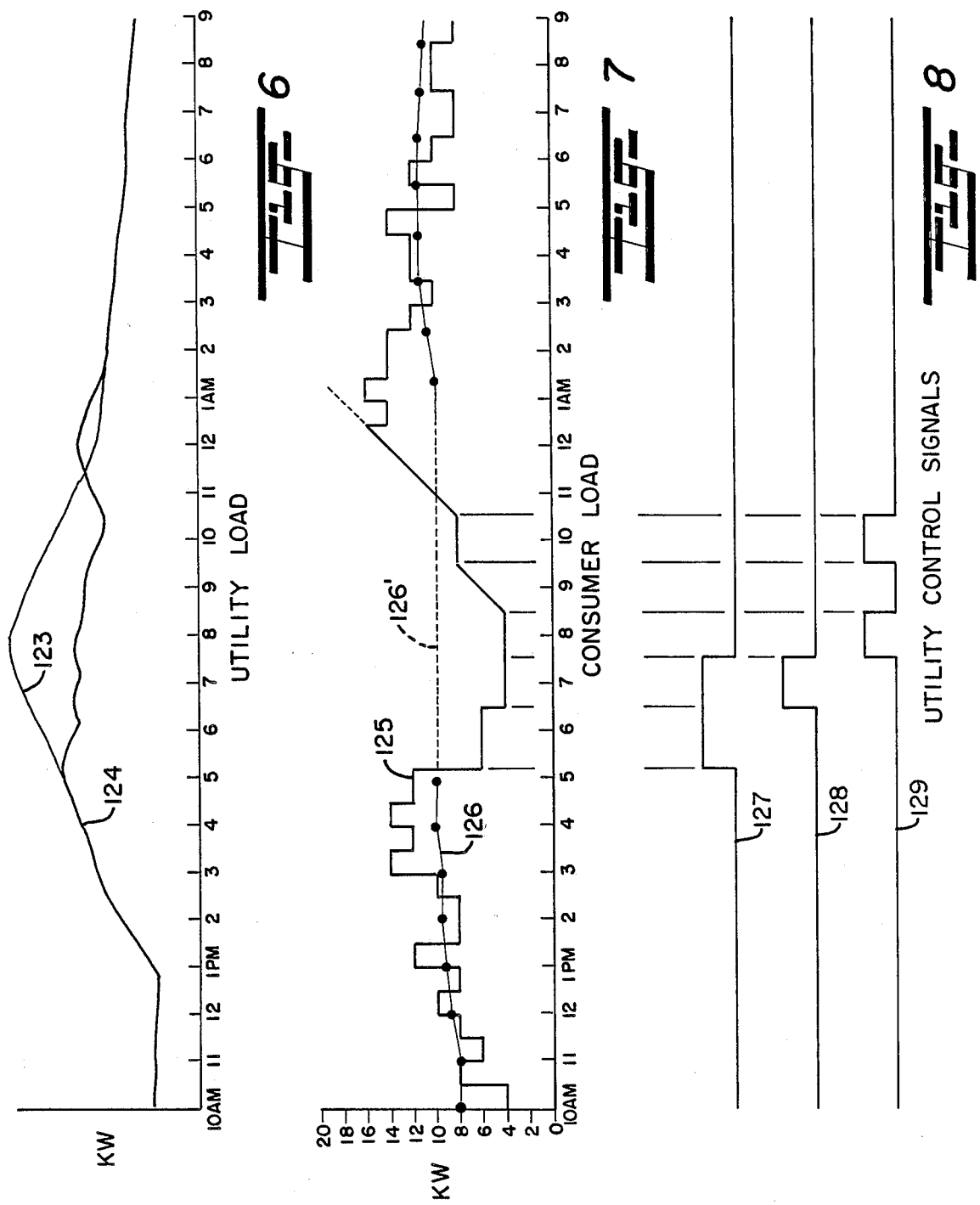

VARIABLE-LIMIT DEMAND CONTROLLER FOR METERING ELECTRICAL ENERGY

CROSS REFERENCE TO MICROFICHE APPENDIX

Reference is made to the Microfiche Appendix consisting of one microfiche and eighty-seven frames.

This invention relates to a method and means for energy management; and more particularly relates to a novel and improved method and system for controlling electrical power consumption by a plurality of users.

BACKGROUND AND FIELD OF THE INVENTION

Various energy management schemes have been proposed which require that utility customers limit their electrical power consumption during periods of peak demands or as a means of reducing overall utility costs. In such schemes, the maximum load which each customer is allowed to place on the utility has been somewhat arbitrarily limited. Representative of such approaches is that disclosed in U.S. Pat. No. 4,247,786 to W. P. Hedges in which each user or consumer selects the maximum load irrespective of actual usage of power. Although the foregoing and other approaches are effective in reducing the customer's overall utility costs, they present a number of problems both to the customer and to the utility. The arbitrary selection of the demand limit is usually based on worst case conditions so that, for example, the demand limit must be selected such that the user does not suffer undue discomfort on the colder days of the year; however, at other times of the year the user would then save less and the utility would have less reduction as a result of the higher demand. Thus, if a peak usage period occurred in the summer months when there was no heating load, no reduction in demand could be effected by the system because of the high demand level selected.

Among other problems associated with conventional demand reduction schemes is that the utility only knows how much energy is used by a customer but not the rate of use or the demand of the customer. As such, neither the utility nor the customer has accurate guidance with respect to proper setpoint selection or utility control. Further, utilities are in the business of selling energy; however, imposing arbitrary demand limits can only reduce the amount of energy sold during periods when demand control is not required. Still further, arbitrary and customer selectable demand control setpoints must be verified by installation of expensive meters which record the demand usage and which periodically must be read, reset and billed.

Accordingly, it is desirable to provide an energy managment method and system which will enable the utility to modify the rate of using energy at any time of the year in accordance with actual demand usage patterns of each user during that period, will allow variable demand control limit selection which will thoroughly and equitably distribute the reduction among its customers and will allow the utility to maximize its energy sales. At the same time it is desirable to avoid the need for demand meters, to efficiently reduce the total load of the utilities generating facilities as well as to proportionately reduce the amount of energy consumed in accordance with the actual usage patterns of each user.

SUMMARY OF THE INVENTION

Accordingly, it is an object of the present invention to provide for a novel and improved energy management method and system which is highly efficient and dependable in use.

It is another object of the present invention to provide for a novel and improved energy management system wherein modifications of power from a utility can be accurately tailored to the needs of the individual users; and more particularly wherein any modification of power can be adjusted in accordance with actual energy usage patterns of each user.

It is a further object of the present invention to provide for a novel and improved electrical energy management method and system which permits selection of equitable demand limits both during high periods of usage and low periods of usage according to actual usage patterns of each user preceding any imposition of a reduction or increase in power.

In accordance with the present invention, there has been devised a method for regulating power to be delivered to each of a plurality of users wherein in each user has variable demands for power consumption, there being a power source, means for delivering power to each user and a utility control signal transmitted from the power source to each user in order to modify the power consumed by each user. In this setting, the present invention is characterized by the steps of measuring the power consumption of each user and modifying the power consumption by each user in response to a utility control signal transmitted to the users by an amount correlated with the power consumption measurement of each user. Preferably, the power consumption of each user is measured over a predetermined real time interval to generate a usage pattern, then the average power consumption is determined from that interval for usage pattern of each user; and that usage pattern is continuously updated and typically is done between periods of power reduction or modification. Thus, for example, when a utility control signal is transmitted during periods of peak power usage to signal a particular percentage reduction in power to be consumed by each user, the actual percentage reduction is a percentage of the average power consumption of each user, as opposed to arbitrarily reducing each user's consumption by a corresponding amount or by a percentage of power consumption which has been arbitrarily selected either by the utility or by the customer.

Among other desirable features of the present invention is the ability to interrupt power reduction for a particular user in the event that the temperature at the user's locale is below a predetermined level. In carrying out the foregoing and other advantages and features of the invention, each user is furnished with a variable demand limit controller which is program controlled to determine and calculate the user's energy usage pattern, to average same and to apply the percentage reduction or change in response to receipt of a utility control signal from a remote location.

The above and other objects, advantages and features of the present invention will become more readily appreciated and understood from a consideration of the following detailed description of a preferred embodiment of the present invention when taken together with the accompanying drawings of a preferred embodiment of the present invention, in which:

BRIEF DESCRIPTION OF THE DRAWINGS

FIGS. 6, 7 and 8 are graphs depicting energy curves generated in response to utility control signals when applied to a limit controller in accordance with the present invention.

DETAILED DESCRIPTION OF THE PREFERRED EMBODIMENT

Figure 1:
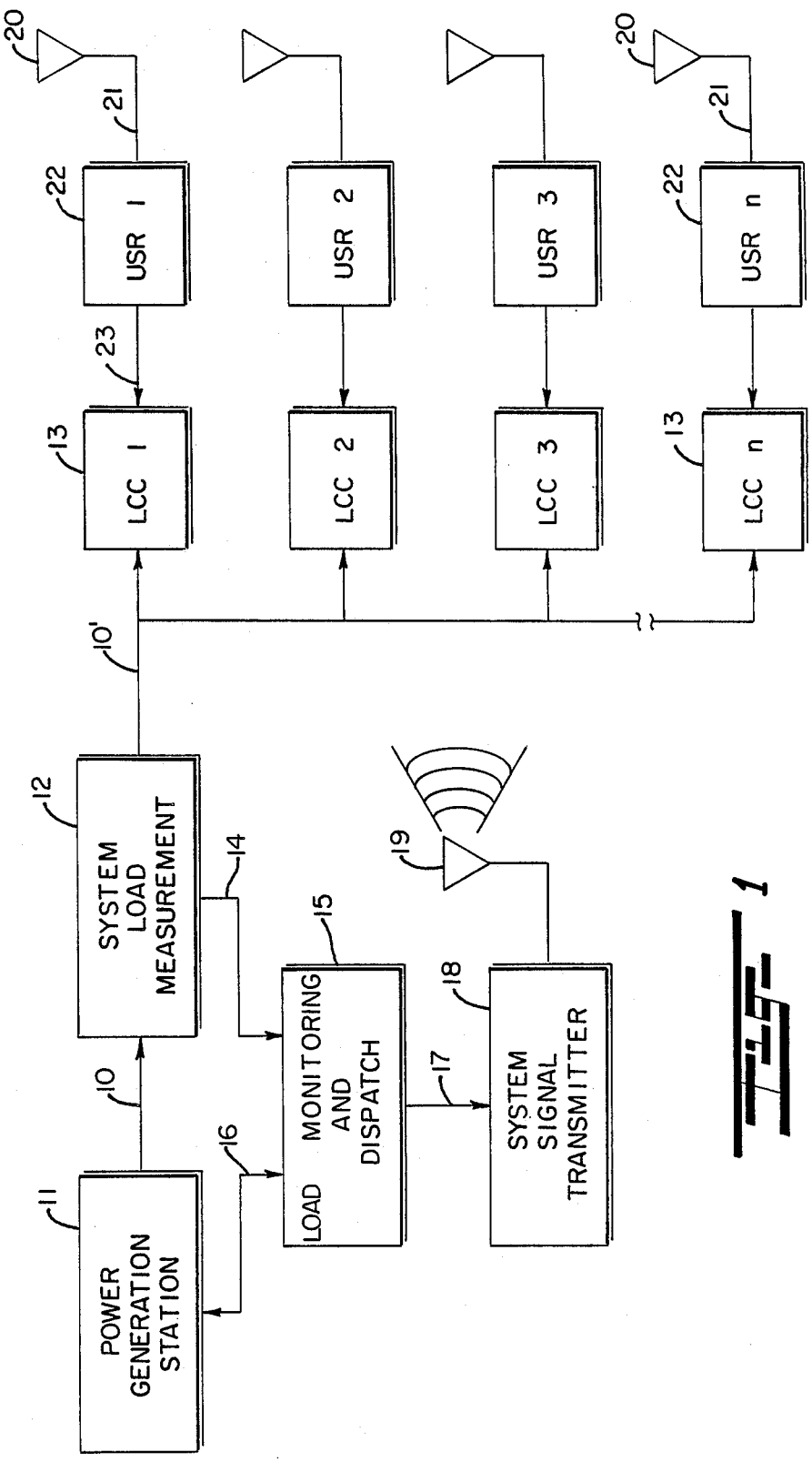
FIG. 1 is a block diagram of a typical electrical power generation and distribution system.

Referring in more detail to the drawings, there is shown by way of illustrative example in FIG. 1 a utility power generation and distribution system for a plurality of individual consumers in which power from a power generating source 11 is transmitted over line 10 through system load measurement facilities 12 to a plurality of individual load control circuits 13 via line 10'. As a setting for the present invention, the individual load control circuits 13 are located at each customer building or residence, and the power consumed by those circuits is monitored by the system load measurement facility 12 and the information then delivered over line 14 to a load monitoring and dispatch facility 15. Additional information is supplied over line 16 to the facility 15 from the power source 11 relating to the status of the various elements in the power generation facilities, such as, total available power. The information from the power source 11 and the system load measurement 12 are utilized to make decisions in the monitoring and dispatch facility 15 as to whether the total load on the power source 11 must be decreased or increased and the amount of such decrease or increase. These decisions, in the form of demand limit increase or decrease signals are sent to a system signal transmitter 18 which transmits the signals via radio transmitting antenna 19 to a plurality of receiving antennas 20, each antenna 20 transferring the signal via line 21 to a utility signal receiver 22 which is connected via line 23 to one of the load control circuits 13.

For the purpose of illustration, the decision is made at the dispatch facility 15 that the total load on the power source 11 must or should be reduced by a selected amount, and a command is delivered from the transmitter antenna 19 to each of the receiver antennas 20 to signal the load control circuit 13 to start reducing the load, such reduction based on the energy usage pattern of each customer in a manner to be hereinafter described in more detail. In accordance with standard practice, one or more signals may be delivered by the antenna 19 to each of the receiver antennas 20 to effect the ultimate desired reduction in load on the power source. In a similar manner, a utility may determine through its load monitoring and dispatch facilities 15 that the total load on the power source 11 may be increased, as a result of which signals are delivered via the antenna 19 to effect an increase in load at each load control circuit. Most importantly, however, the utility company's objective of reducing the system load can be fulfilled with a minimum and equal impact upon the consumer, since in a manner to be described the amount of load reduction is based on the individual consumer's energy usage pattern; and each consumer is subjected to precisely the same utility control signal which will operate to reduce each customer's demand limit by a corresponding percentage of the customer's actual usage of energy preceding the application of the control signal. Correspondingly, if additional power is available, the energy available for each customer may be simultaneously increased by an equal percentage or rate.

Figure 2:
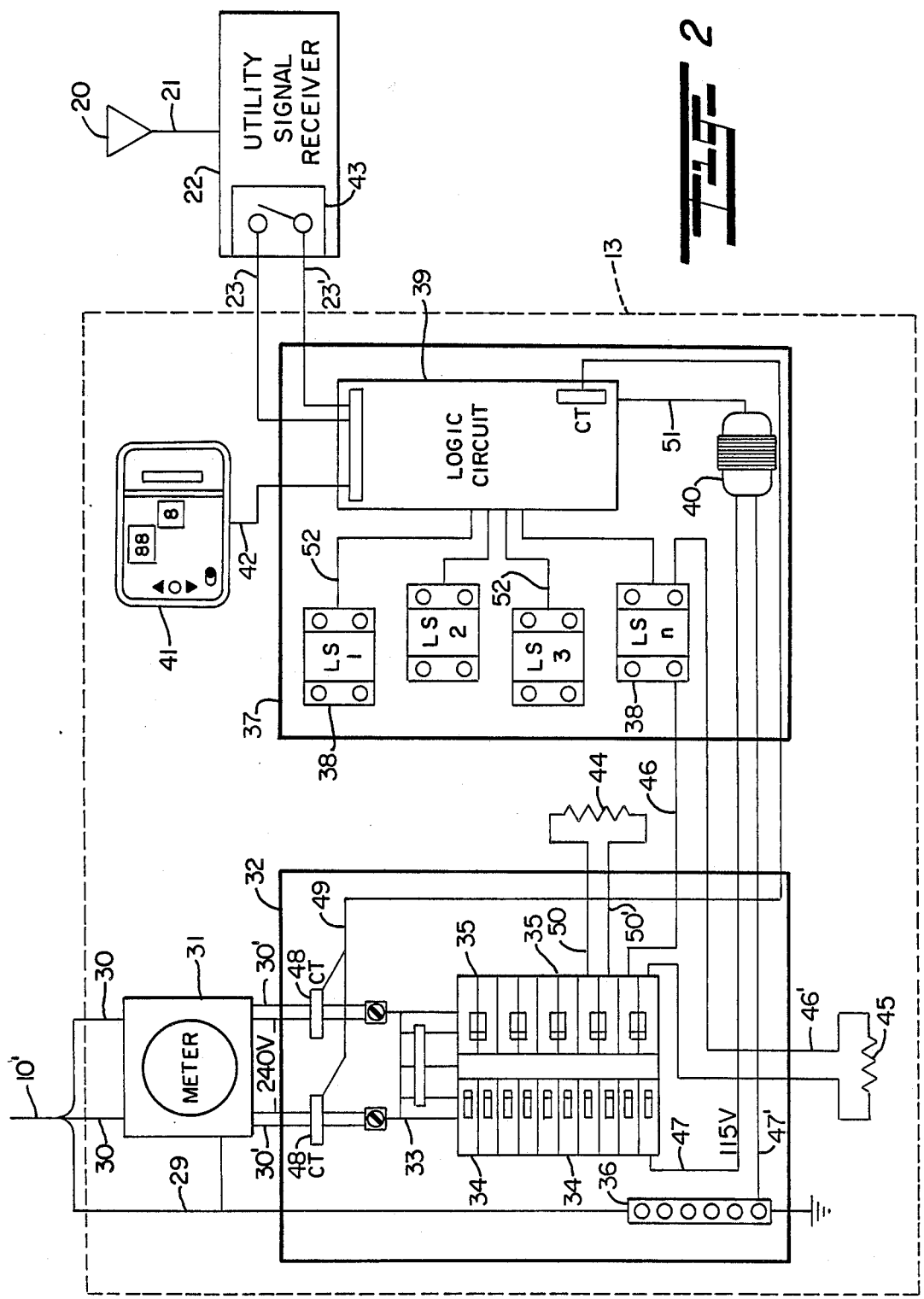
FIG. 2 illustrates somewhat schematically a load control circuit at each consumer's location in accordance with the present invention.

A preferred form of load control circuit 13 at each customer's location is illustrated in FIG. 2. Here, the power which is delivered from the power source 11 is applied over two or more power delivery lines 30 and a neutral line 29 for delivery to the circuit 13 and measured by a conventional metering device 31 for utility billing purposes. The meter 31 is connected to each consumer's main electrical distribution panel 32 which typically comprises a main circuit breaker 33, a plurality of single pole circuit breakers 34, a plurality of double pole circuit breakers 35, and an earth ground terminal block 36. A variable limit demand controller 37 controls the rate of energy usage in the control circuit 13 and consists of a plurality of load control switches 38, a logic circuit 39 which contains the logic necessary to operate the controller 37 and a voltage reducing transformer 40 which supplies power at logic voltage levels to the controller 37 via line 51. An optional data display panel 41 is connected to the logic circuit 39 via line 42 to allow the consumer to monitor the operation of the circuit 13 and to modify the operation of the controller 37 for functions not related to demand limit set points, such as, the order in which the loads are shed. The logic circuit 39 is connected via lines 23 and 23' to a plurality of switch contacts 43 within the receiver 22. The contacts 43 may open or close in response to a utility control signal to indicate that utility control is active and to instruct the controller to operate in a predetermined manner. The length of time that the contacts 43 are actively requesting control is determined by the length of the peak load that the utility is experiencing and typically may be one to eight hours in duration.

A plurality of uncontrolled loads are designated at 44 and are made up of loads which are not under the influence of the controller 37, such as, refrigerators, lighting circuits and small appliances. The loads 44 are connected to the circuit breakers 34 and 35 by line connections 50 and 50'. Likewise, a plurality of controlled loads 45 which are under the influence of the controller 37, such as, heating, cooling and controllable large appliance circuits are connected to the circuit breakers 34 and 35 and are also routed via lines 46 and 46' through the load switches 38 of the controller 37. The load control switches 38 are controlled by the logic circuit 39 via line 52. In turn, lines 47 and 47' deliver power from the circuit breaker 34 to the transformer 40 in order to energize the controller 37. The energy usage of the uncontrolled loads 44 and the controlled loads 45 are measured together by the power usage sensor circuit which is in the form of current sensing transformers 48 on the power lines 30', and the energy usage information is delivered to the logic circuit 39 via line 49. The power usage data thus obtained is used by the logic circuit 39 to develop an energy usage pattern.

Figure 3:
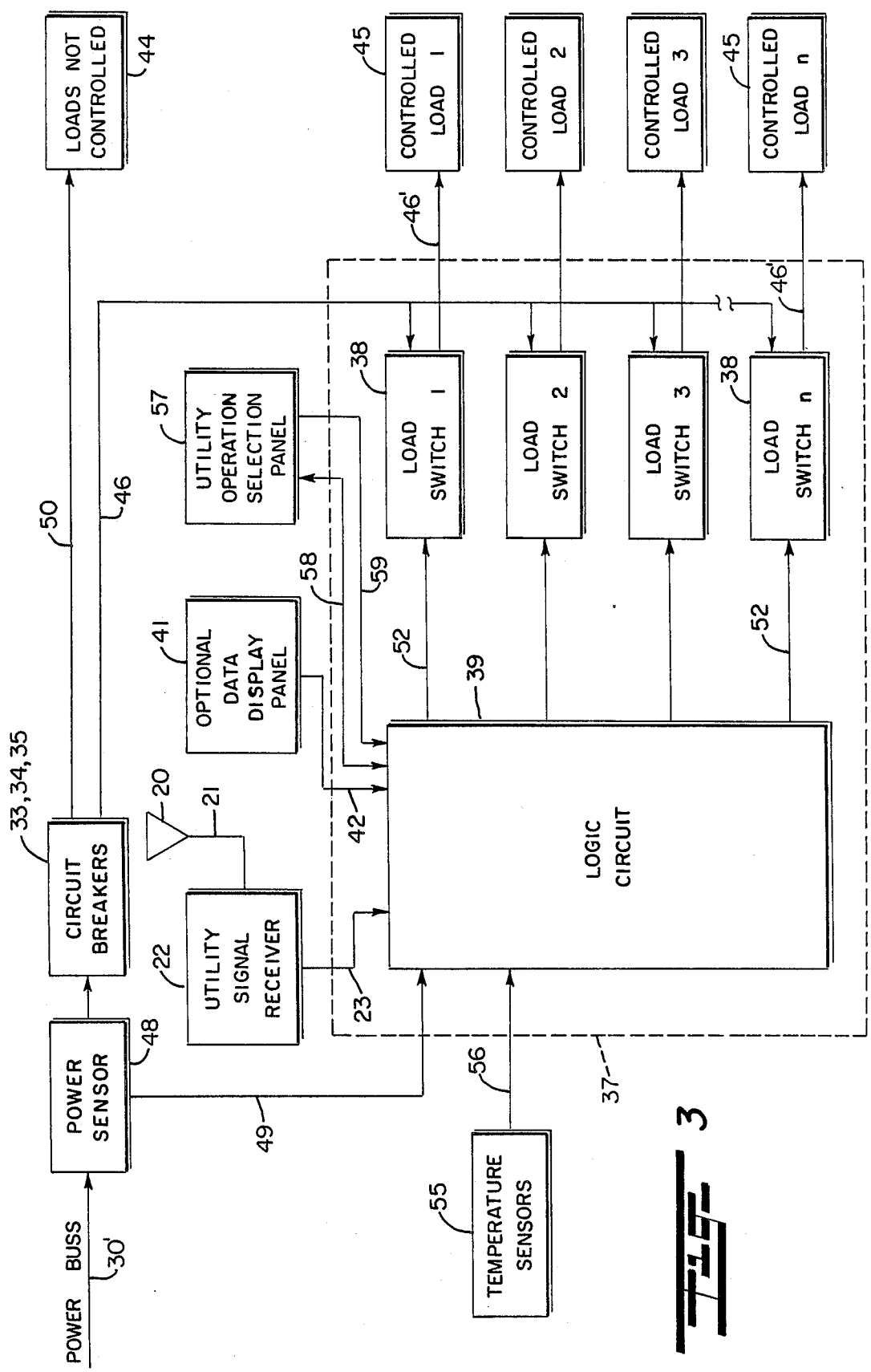
FIG. 3 is a block diagram illustrating a variable demand limit controller forming a part of the load control circuit in accordance with the present invention.

The load control circuit 13 of FIGS. 1 and 2 is further illustrated in FIG. 3 to illustrate the additional use of temperature sensors 55 connected to the logic circuit 39 via line 56 in order to monitor the temperature in the consumer's building such that the logic may intervene during demand control periods and raise the demand control limit should the temperature rise above or fall below predetermined limits. A utility operation selection panel 57 is connected via lines 58 and 59 to the logic circuit 39 in order to permit utility personnel to enter operational parameters into memory locations in the logic circuit. Those operational parameters are, for example, demand percentage reduction levels, limits for temperature intervention or for demand control set point. Information contained in the panel 57 and transmitted to the logic circuit via line 59 offers the capability of unlocking the logic circuit 39 so that the parameters may be entered only by utility personnel, or of locking the logic circuit such that the parameters in the controller 37 may not be modified by the consumers.

Figure 4:
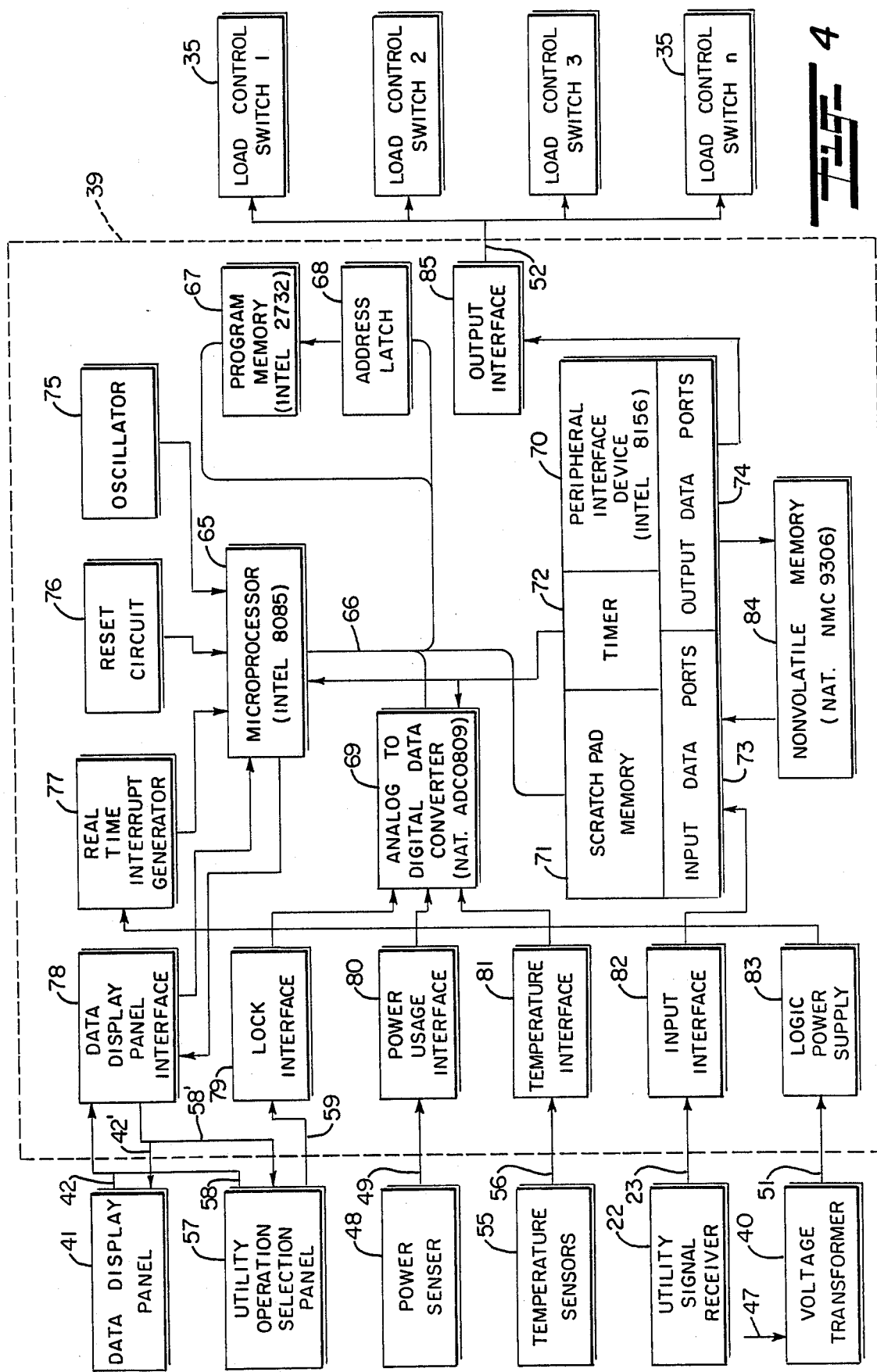
FIG. 4 is a block diagram of the controller logic circuit in accordance with the present invention.

More detailed elements of the logic circuit 39 are illustrated in FIG. 4 including the industry type number for those integrated circuits used to implement the design of the logic. As shown, a microprocessor 65 is interconnected via a data buss, address lines, timing signals and device select lines represented by common line 66 to a program memory 67, address lines 68, analog-to-digital converter 69, and a peripheral interface device 70. The memory 67 contains the program control required to make the processor 65 operate the controller logic circuit 37. The address latch 68 is required to interface the memory 67 to the processor 65, since the latter has a multiplexed data buss. The analog-to-digital converter 69 converts analog data into binary data for the processor 65. As shown, the device 70 is an integrated circuit which is made up of four primary sections: (1) scratch pad memory 71 is a random access memory used by the microprocessor 65 to store temporary and changing data, such as, the energy usage patterns, time clock intervals and mathematical results; (2) timer 72 provides variable time interval interrupts for the microprocessor 65 and clocks the converter 69 for converting the analog data; (3) input data port 73 provides digital input information to the microprocessor 65; and (4) output data port 74 is set by the microprocessor 65 to control the loads and other circuit functions. An oscillator 75 defines a high frequency clock source to step the microprocessor 65, and a reset circuit 76 initializes the logic circuit when power is applied.

The microprocessor 65 must perform some of its functions based on real time via a real time interrupt generator 77 which derives its time base from the frequency of the alternating current power source available from the logic power supply 83. Generator 77 is therefore connected to the microprocessor 65 to selectively interrupt its operation based on real time. The microprocessor 65 is connected also to the data display panel interface 78 with one input line and one output line to receive and send data, respectively, to the optional data display panel 41 and the utility operation selection panel 57. The panel 57 has an output line 59 to the lock interface 79 connected to the converter 69 as an input to the logic to indicate that the panel 57 is present and that the logic circuit may accept data changes of any type. The power usage sensor defined by the current sensing transformers 48 inputs the load measuring information signal via line 49 to a power usage interface 80 which scales the signal to a meaningful level for insertion into the converter 69. The temperature sensors 55 also feed their signals to the temperature interface 81 in scaling the information for insertion into the converter 69. Utility control signals which appear at the receiver contacts 43 are input via line 23 to the input interface 82 which filters the signals and scales the signal level for insertion into the input data port 73 of the device 70.

The power source for the controller is supplied from the line 47 and applied to the voltage transformer 40 where it is input over line 51 to the logic power supply 83, the latter generating direct current voltage sources to operate the controller logic and also generates an alternating voltage at the line voltage frequency for the real time interrupt generator 77. The non-volatile memory 84 is an integrated circuit which is capable of memory retention when no power is supplied to it, and is used to store parameters including data that the logic generates in case there is a power failure. The memory 84 preferably includes a signal input/output configuration and therefore sends data to input data port 73 as well as receives data and clocking signals from the output data port 74. In order to control the load control switches 38, the microprocessor sets the output data status on the output data port 74 which is directed to the output interface 85, then to the load control switches 38 via line 52.

Figure 5:
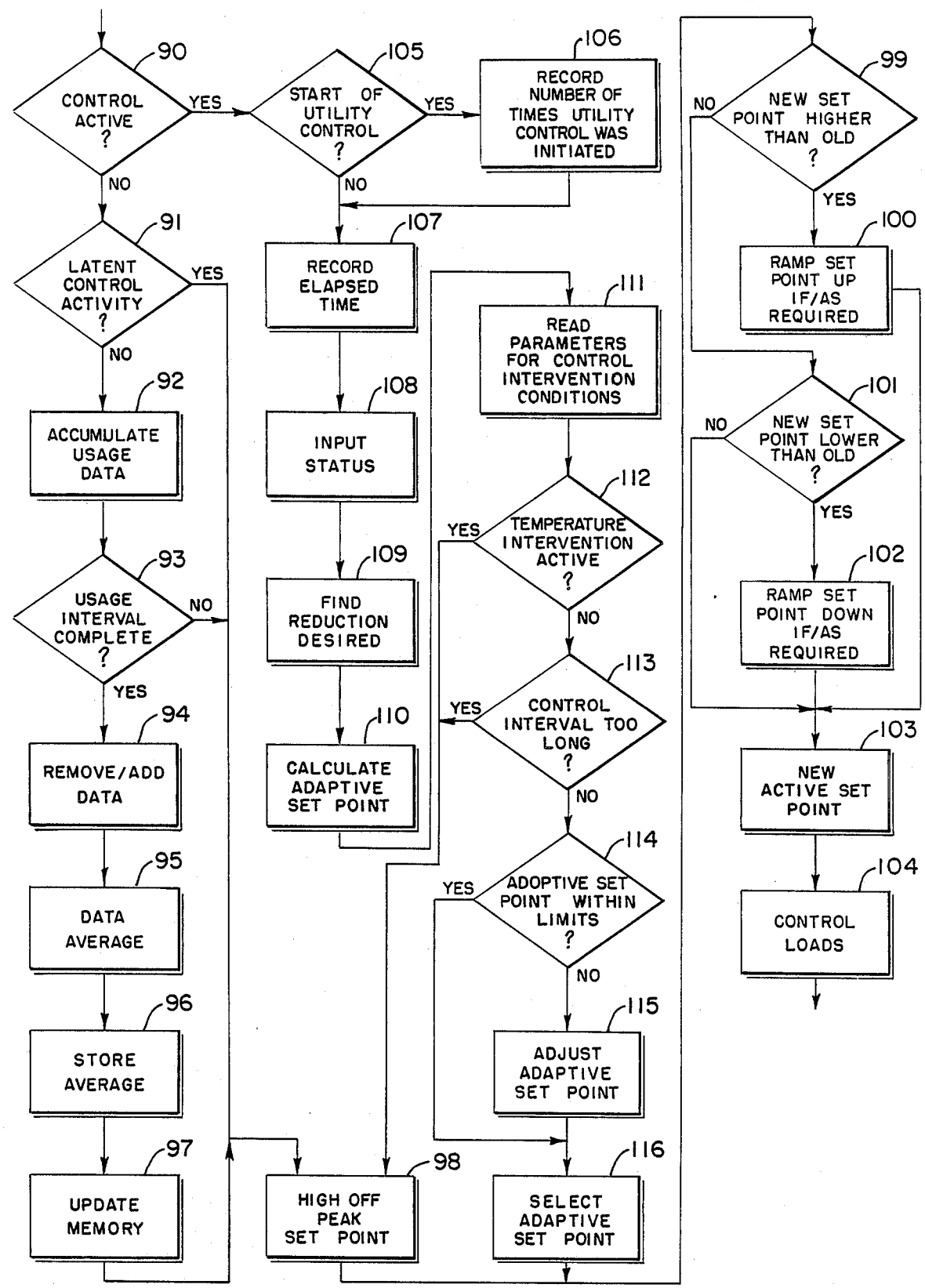
FIG. 5 is a flow chart illustrating one form of logic employed in the limit controller of the present invention.

As a preliminary to a description of the flow chart shown in FIG. 5, the following definitions are believed helpful to an understanding of the present invention:

USAGE PATTERN: A variable length array of energy usage data which is collected by the controller 37 over incremental units of time to obtain a pattern of the energy usage of the customer. For example, an array which contains energy usage data for twenty-four one-hour increments.

ADAPTIVE DEMAND: A value which is mathematically derived from the usage pattern to fairly represent the data in that pattern. The value derived is used as a basis for setpoint calculations during an interval where demand control is desired. For example, the average of the usage pattern data over twenty-four hours may be calculated to obtain a value for the adaptive demand.

ADAPTIVE SETPOINT: A control setpoint mathematically derived from the adaptive demand using the information received from the utility at the signal inputs of the controller. For example, one input being active could signal the controller to start controlling with an adaptive setpoint equal to 50% of the adaptive demand. As another example, an input being active may cause the adaptive setpoint to start at the adaptive demand value and decrease at the rate of 6 kilowatts per hour as long as the input is active.

ACTIVE SETPOINT: The active setpoint is the setpoint that the controller is using at any time to define the level at which load control is being implemented. For instance, when the utility signals are active, the active setpoint may be the adaptive setpoint whereas at other times the active setpoint may be at an extremely high level such that no control occurs, namely the uncontrolled setpoint level.

LOAD CONTROL: The control of selected electrical loads in a building which are turned on (restored) and off (shed) based on a comparison of the active setpoint to the instantaneous load and its integrals over time.

RAMPING SETPOINT: A setpoint which is moving from one value to another with a gradual rate of change. For instance, the active setpoint may move from the adaptive setpoint to the uncontrolled setpoint at the rate of 10 kilowatts per hour.

The computer program code including that portion which resides in program memory 67 of FIG. 4 has been deposited with the Patent Office pursuant to 37 C.F.R. §1.96 and is incorporated by reference herein. Only that part of the program which is applicable to variable limit demand controller operation is hereinafter described by reference to the flow chart of FIG. 5 where computer function steps are indicated within rectangles and logic steps or decisions within parallelograms. The program as represented by the flow chart is entered periodically, such as, on the order of every 30 seconds, by a time based signal generated from the real time interrupt generator 77. The signal is input at 90 where inquiry is made whether or not the receiver contacts 43 are active to request utility control. If the contacts are not active, the program proceeds to 91 where the logic determines whether latent utility controlled activity is still in progress; i.e., whether an operation may still be in effect as a result of prior utility control activity and possible constraints which could be instituted at 100. If latent control is in effect, the program advances to 98; but if not in effect, proceeds to 92 where the logic reads the most recent energy usage that occurred since the last time the program was entered. The usage data is accumulated at 92 in the memory 71 until the incremental unit of time over which data is to be accumulated has elapsed. At 93 the decision is made whether or not the interval for collecting usage data is complete, and if not complete, the usage data is accumulated and the routine proceeds to 98. If the interval is complete, the program steps to 94 to remove the usage data from an array of data usage storage locations in the memory 71 and inserts the newly accumulated usage data into the array. At 95, the logic accesses the usage data stored to determine a value for the adaptive demand; i.e., the average usage data stored over a predetermined real time interval. In the case shown, the logic sums the array and divides the total by the number of entries in the array to obtain the average and this is stored in the temporary memory 71 for subsequent use as the adaptive demand value. In the event of a power failure which would cause the memory 71 to lose its contents, the logic at 97 stores the new adaptive demand value in the memory 84 to preserve it. The high offpeak setpoint at 98 is set high enough to assure that notwithstanding arrival of the logic from 91, 93 or from 97 no control will occur. A decision is then made at 99 whether the new setpoint is higher than the setpoint from the preceding routine and, if so, the setpoint is increased to the higher value at 100. Specifically, the logic at 100 interrogates the operating parameter memory 84 to determine if it should make an abrupt change to the higher setpoint value or should incrementally increase over time, or ramp up, the setpoint to the higher value selected. Ramping up of the setpoint as described is achieved in the logic controller circuit as illustrated in FIG. 4 by means of retrieving the ramp rate from its operating parameter memory 84 and applying that rate to the active setpoint. For instance, the data in the operating parameter memory may instruct the controller to ramp the setpoint up at the rate of 0.2 kilowatts every two minutes to effect a 6 kilowatt per hour ramp. Being such, the logic would add 0.2 kilowatts to the active setpoint every two minutes until the upper limit then in effect is reached. If the setpoint is not higher, the logic proceeds to 101 and, if the setpoint is lower than the preceding setpoint, is reduced to the lower value at 102. If not, it is advanced to 103 which in either case will establish the setpoint either from 102 or 100, or use the initial value, as the new active setpoint. The new active setpoint is established as the limit for demand control operation and is compared with the present instantaneous power usage at 104 and integrals of the demand usage over time to determine whether the controller should turn the controlled loads on or off.

In the routine as described, in the absence of a utility control signal the controller logic 39 will collect the usage pattern and determine the adapative demand value. This is the most realistic time to collect usage data because at other times when the utility control and demand limits are imposed on the customer, the usage data may not reflect the true usage patterns. If the utility receiver contacts 43 are active to signify that control is required, the logic employs the adaptive demand value determined when the contacts 43 were not active to establish a new adaptive demand setpoint. Thus, the decision is made at 90 to proceed to 105 where a determination is made whether the logic is at the start of utility signal activity. If so, the logic at 106 records the number of times utility control has been initiated and stores that value in the memory 84 so that data may be obtained to insure that the system has not failed or has not been tampered with. The logic then proceeds to 107, which is also the negative route from 105, where the logic records the time elapsed under utility control and adds it to any previously elapsed time for storage in the memory 71. This value is also stored in the memory 84 so that utility personnel may obtain that data. At 108, a determination is made as to the status of the contacts 43 to determine whether the demand limit is to be reduced, and at 109 determines from the memory the percentage reduction. At 110 the logic reads the adaptive demand value stored in the memory 71 and multiplies it by the percentage value to calculate the adaptive demand setpoint desired by the utility. For example, if the percentage reduction stored in the memory 84 is 60%, the adaptive demand value is multiplied by 60% to calculate the new setpoint which is stored in the memory 71 to establish the active setpoint once the other program parameters have been tested for compliance. At 111, the parameters from the memory 84 are accessed to determine whether any intervention control additions exist to prevent operation of the new values. Thus, at 112 a comparison is made of the reading from a temperature sensor 55 which may be located at the customer's locale and which is compared with a predetermined temperature value stored in the memory 84 so as to intervene in the event that the temperature measured is outside of a predetermined limit. For example, if the temperature measured was below the limit established, the logic then returns to 98 where the higher setpoint will intervene and override the utility control operation. If negative at 112, the logic determines at 113 if the time that utility control has been continuously active is longer than a predetermined limit stored in the memory 84. If so, the logic advances to 98 to intervene as described. This will assure that the circuit will be returned to the uncontrolled state in the event of a failure in the system which would maintain the utility control signal in an active state beyond a predetermined time limit.

If the control interval is not too long at 113, the logic proceeds to 114 which tests the adaptive demand setpoint value calculated at 109 to determine if it is within any preselected limits imposed by the utility and stored in the memory 84. If the value is not within those limits, the logic proceeds to 115 where the value of the adaptive demand setpoint is adjusted to be within those limits and a new adaptive demand setpoint is generated. The logic then proceeds to 116 and selects the adaptive demand setpoint as a control limit to be further processed at 99 in the manner hereinbefore described. It will be noted that the logic proceeds directly to 116 from 114 if the adaptive setpoint is determined to be within the limits imposed by the utility.

FIGS. 6 to 8 graphically illustrate the effect of one or more applied utility control signals represented in FIG. 8 on the consumer load, as shown in FIG. 7, when a peak in the system occurs over a 24-hour period, as represented in FIG. 6. Thus, the narrow line designated at 123 in FIG. 6 represents the gradual increase in power utilized, expressed in kilowatts, in the absence of any utility control. The wider line 124 illustrates the reduction in power when a utility control signal(s) is applied to indicate that the power consumed by a plurality of consumers has reached a predetermined level. The consumer load curve of FIG. 7 illustrates the power consumption of an individual consumer wherein the bold face line 125 shows average demand usage over each one-half hour period. From an illustrative period ranging from 5:10 P.M. to 12:30 A.M. the circuit is under utility control and is limited by the setpoint established by the demand controller logic 39. The average demand usage pattern, or adaptive demand value, is represented by the solid line 126 and the calculation which is made in the program control circuit or logic control 39 preceding the transmission of a utility control signal. The dotted section of the line represented at 126' illustrates the average demand or adaptive demand value during the period when the utility control signal is applied during the interval of time from 5:10 P.M. to 12:30 A.M., bearing in mind that this is an extension of the average value or usage pattern calculated prior to application of the utility control signal, since no usage data is collected during the period when the utility control signal is applied.

Assuming that the utility transmits a first utility control signal, represented by line 127 in FIG. 8, and that the logic controller is programmed to impose a control at 60% of the adaptive demand value determined by each of the controllers in the system, the actual consumer load will drop to a level of 60% of the adaptive demand value, as illustrated by the reduction or drop followed by the line 125 in FIG. 7 at 5:10 P.M. In the system shown, the adaptive demand value is 10 kilowatts at the time the signal is initiated and therefore the controller multiplies that value by 60% to yield an adaptive demand setpoint of 6 kilowatts which the controller, in this example, immediately applies to the load control circuit. The utility load line 124 also starts to drop as a result of the reduction; however, at 6:30 P.M., the load has continued to rise so that the utility issues a second control signal 128, as shown in FIG. 8, which in combination with the first signal requests operation at 40% of the adaptive demand level. Thus, the adaptive demand setpoint is calculated to be 4 kilowatts and the controller initiates control at that level.

Assuming that the further reduction imposed by the second utility control signal is sufficient to maintain overall power consumption within preset limits, the utility may then issue a hold signal as represented by line 129 to withdraw the two previously issued signals. Specifically, the hold signal 129 instructs the controller to hold the demand limit at its present level of 4 kilowatts. At 7:30 P.M., the utility load line 124 has started to decrease and the hold signal 129 is then withdrawn to increase the demand limit, as a result of which line 125 starts to increase at a rate of 4 kilowatts per hour. This rate is determined by ramping the setpoint up at a predetermined rate rather than to experience a sudden jump in setpoint. At 9:30 P.M., if the utility load line 24 has not decreased the utility may reissue a hold signal 129 to instruct the controller to hold its setpoint at the present level; namely, 8 kilowatts. At 10:30 P.M. the utility load line 124 is in a decreasing pattern and the utility will therefore withdraw the hold signal and allow the setpoint of the controller to continue to rise at a rate of 4 kilowatts per hour. At this point, the utility load line will start to rise and display a tendency toward establishing a new load peak known as the "payback effect" which is generated by the loads having been starved during the control period. However, the ramping up of the setpoint at a controlled rate will tend to minimize that payback. At 12:30 A.M., a consumer load line 125 will stop tracking the 4 kilowatt per hour rate of rise imposed on the setpoint by the controller since the load on the circuit is less than the setpoint. The load control circuit is now uncontrolled and, as can be seen by line 126, the controller starts to collect the usage data for the purpose of deriving a new adaptive demand value preliminary to starting a new cycle.

From the foregoing, the present invention is seen to provide a method of electrical energy management in which each customer is provided with a variable limit demand controller 37 including means responsive to a remotely generated, utility control signal. The controller will monitor and store the energy usage pattern of the customer and employ same as a basis for calculation of an adaptive demand value. The adaptive demand value is constantly updated by the controller and when a utility control signal is received from the utility, the controller will calculate a new setpoint to be used by the controller to reduce the amount of power consumption in the load control circuit associated with the controller. The established demand limit may or may not be further modified by additional utility control signals. Moreover, the logic of the controller may intervene and override the utility control signals when it is determined that the control interval is too long or in some manner detrimental to the customer. The new adaptive setpoint established by the controller is based on a usage pattern derived from the average rate of electrical usage over a predetermined real time interval preceding the application of the control signal. Of course, average usage may be established in various ways, such as, by integrating the data equation to find an average, differentiating the data equation to find the rates of change, or the use of linear regression on the data to predict a trend. The control signal used to modify the adaptive demand value may include instructions either to reduce, increase or hold the existing adaptive demand value at a linear or non-linear rate according to utility load factor objectives.

It is therefore to be understood that various modifications and changes may be made in the method and system of the present invention as hereinbefore described without departing from the spirit and scope of the present invention as defined by the appended claims.

We claim:

1. In a method for regulating power delivered by a utility to each of a plurality of users wherein each user has variable demands for power consumption, there being a power source, means for delivering power to each said user and a utility control signal transmitted from said power source to each user when it is desired to modify the power consumed by each user, the steps comprising:
   measuring the power consumption of each user; and
   modifying the power consumption by each user by an amount correlated with the power consumption measurement of each user when a utility control signal is transmitted to each user.

2. In the method according to claim 1, including the step of transmitting said utility control signal only during peak power usage and reducing the power consumed by each user by a common percentage of the power consumption measurement of each user during peak power usage.

3. In the method according to claim 1, including the step of continuously monitoring and storing measurements of power consumed by each said user over a predetermined time interval to establish an energy usage pattern by each said user, and continuously updating said usage pattern between periods of power reduction.

4. In the method according to claim 3, including the step of establishing a predetermined rate of change in power consumed over a selected time interval when a utility control signal is transmitted to each user.

5. In the method according to claim 1, including the step of measuring the power consumption of each user over a predetermined time interval and calculating an average power consumption over that time interval.

6. In the method according to claim 5, including the step of reducing the power consumption of each user as a percentage of the average power consumed by each user.

7. In the method according to claim 6, including the step of measuring a temperature at each user's locale and comparing with predetermined temperature limits, and interrupting power reduction for each user in the event that the temperature measured is not within said predetermined temperature limits.

8. In a method for regulating electrical power delivered by a utility to each of a plurality of users wherein said users have variable demands for power consumption, there being a power source, means for transmitting electrical power to each said user, and a utility control signal selectively transmitted from a remote location to each said user to increase or decrease the electrical power consumed by each said user, the steps comprising:
   measuring the power consumption of each user over a real time interval to determine an energy usage pattern of each user;
   averaging the power consumption measurement over the real time interval based on the energy usage pattern determined for each said user; and
   reducing the power which can be consumed by each said user by a percentage corresponding to the average power consumption of each said user over the real time interval when said utility control signal is transmitted to each said user.

9. In the method according to claim 8, further including the step of continuously updating the average power consumption of each user over a selected real time interval when next precedes the transmission of a utility control signal.

10. In the method according to claim 8, including the step of measuring the time interval over which power consumption is modified by transmission of a utility control signal, comparing each said time interval measured with a predetermined time interval, and overriding said utility control signal in the event that each said time interval measured exceeds the predetermined time interval.

11. In the method according to claim 8, further including the step of measuring a temperature at each user's locale and comparing with a predetermined temperature level, and overriding the utility control signal transmitted to each user in the event that the temperature measured at that user's locale is below the predetermined temperature level.

12. In the method according to claim 8, including the step of transmitting said utility control signal only during peak power usage of the utility and reducing the power consumed by each user during peak power usage by a corresponding percentage of the average power consumption of each user and removing said utility control signal in response toe reduction in the aggregate of the average power consumption of said users.

13. In an energy management system wherein power is delivered by a utility to each of a plurality of users wherein each user has variable demands for power consumption, said system including a power source, means for transmitting power to each said user and means for transmitting utility control signals from said utility to each user, the combination therewith of a variable demand limit controller circuit for each user comprising:
   program controlled circuit means for measuring the power consumption of each user including means for averaging the power consumption measurement of each user over a real time interval;
   utility signal receiver means for receiving utility control signals transmitted by said utility;
   data storage means for storing a percentage factor therein representative of a desired modification in power consumed by each user;
   calculating means responsive to receipt of each utility control signal by said utility signal receiver means to multiply the average power consumption measured by the percentage factor stored in said data storage means; and
   load control means for modifying the maximum power available to each user by an amount corresponding to the percentage factor of the average power consumption determined by said calculating means.

14. In a system according to claim 13, including means for overriding said utility control signal after a predetermined time interval following the transmission of said utility control signal to said receiver means.

15. In a system according to claim 13, including temperature sensing means, and means for overriding said utility control signal when the temperature is beyond predetermined temperature limits.

16. In a system according to claim 13, said receiver means including means activated in response to transmission of a utility control signal to cause said load control means to modify the maximum power available to each user by an amount corresponding to the percentage factor from the average power consumption determined by said calculating means.

* * * * *